ULTRAHIGH FREQUENCY TUNER

Filed Dec. 20, 1954 2 Sheets-Sheet 1

Inventor
Francis G. Mason
By
Ooms, McDougall, Williams & Hersh
attorneys

Inventor
Francis G. Mason
By
Ooms, McDougall, Williams & Hersh
attorneys.

United States Patent Office 2,913,683

Patented Nov. 17, 1959

2,913,683

ULTRAHIGH FREQUENCY TUNER

Francis G. Mason, Westport, Conn., assignor to Aladdin Industries, Incorporated, Nashville, Tenn., a corporation of Illinois Application December 20, 1954, Serial No. 476,198

3 Claims. (Cl. 333—82)

This invention relates to radio frequency tuners, particularly for use in ultrahigh frequency television receivers or other similar radio equipment.

One principal object of the invention is to provide an improved tuner capable of covering an extremely wide frequency range at ultrahigh radio frequencies.

A more particular object is to provide an improved tuner adapted to cover the ultrahigh frequency (UHF) television band from 470 to 890 megacycles in a single tuning operation.

A further object is to provide an improved ultrahigh frequency tuner affording a generally linear tuning curve of frequency against dial setting.

It is another object of the invention to provide an improved ultrahigh frequency tuner which achieves an extremely high factor of merit or Q.

A further object of the invention is to provide an improved ultrahigh frequency tuner which is rugged and dependable yet compact and inexpensive.

Further objects and advantages of the invention will appear from the following description, taken with the accompanying drawings, in which.

Figures 1, 2:
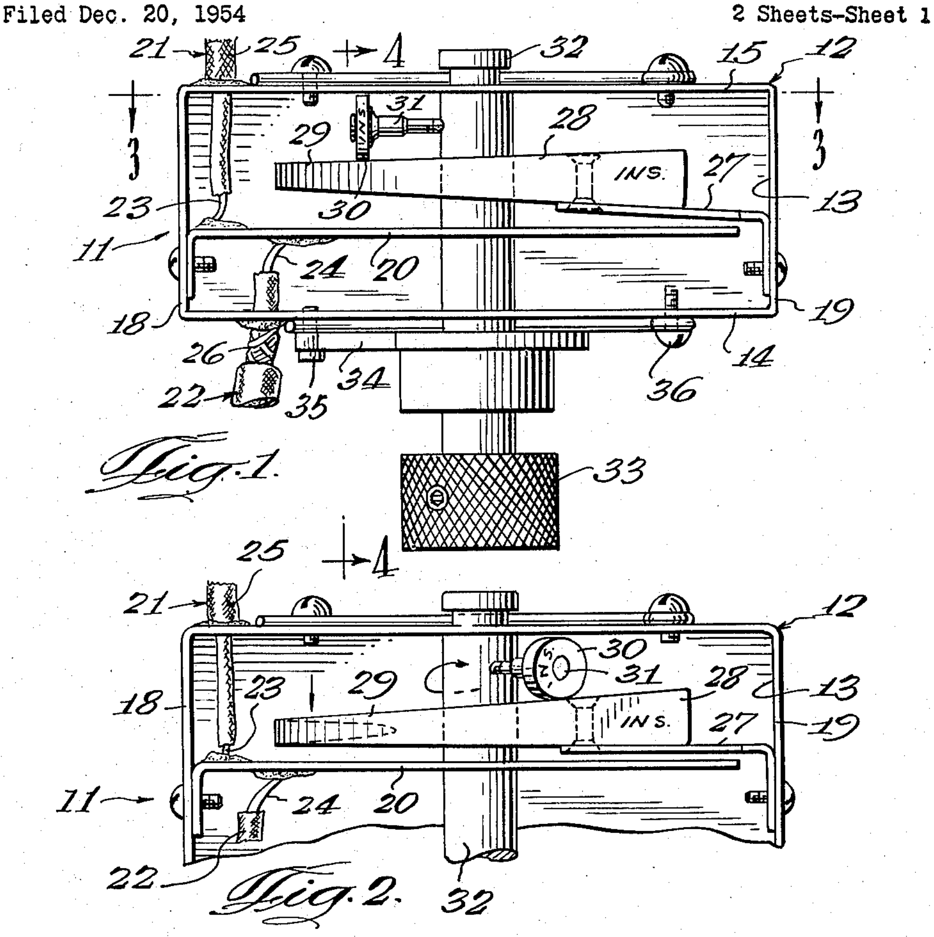
Figure 1 is a plan view of an exemplary ultrahigh frequency tuner constituting an illustrative embodiment of the invention, the view being partly in section along a line 1—1 in Fig. 3.
Fig. 2 is a view similar to Fig. 1, with various components of the tuner shown in changed positions to illustrate the tuning operation.
Figure 3:
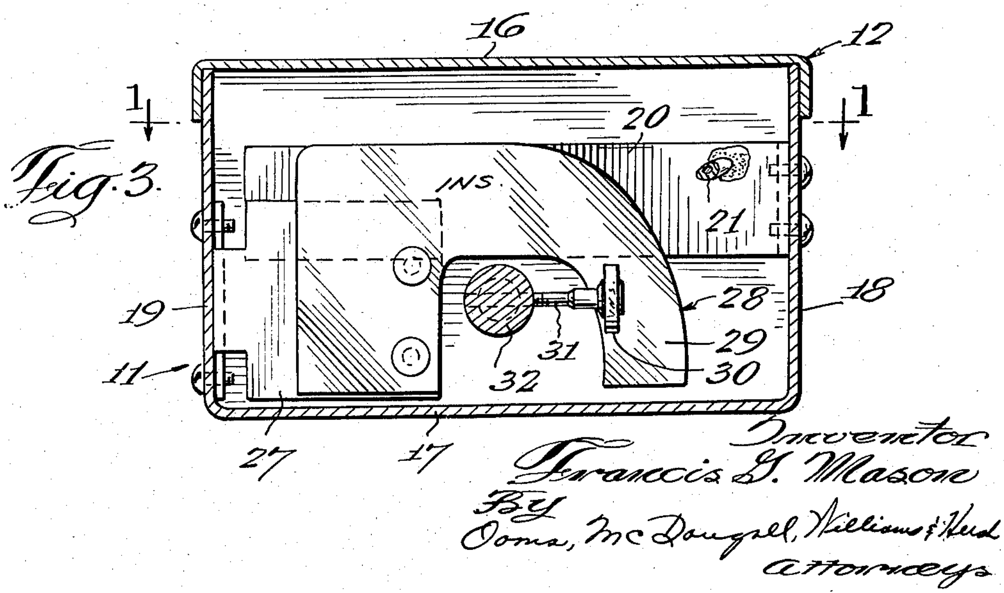
Fig. 3 is a rear elevational view, taken partly in section along a line 3—3 in Fig. 1.
Figures 4, 6:
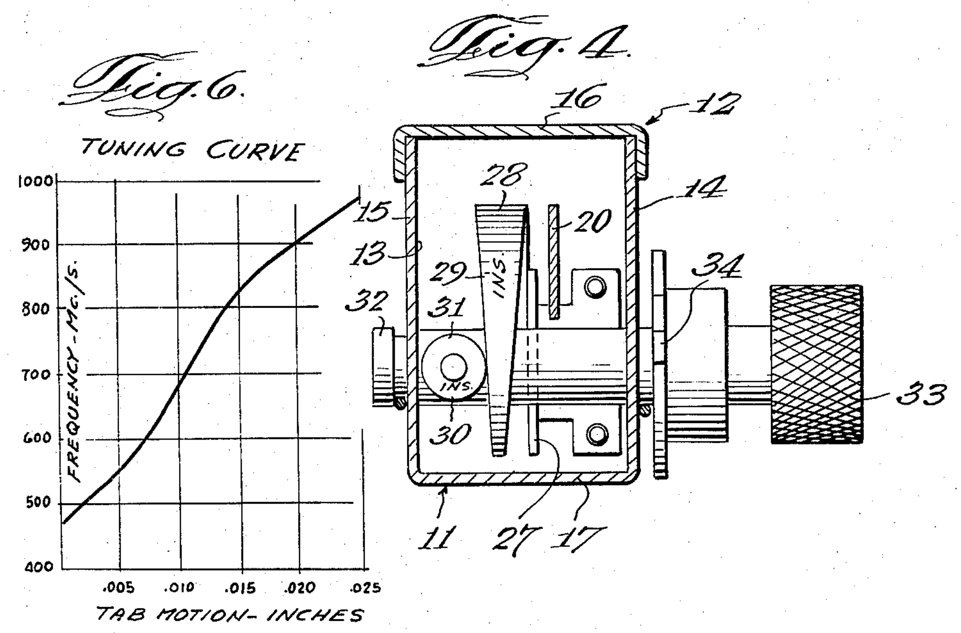
Fig. 4 is a side elevational sectional view taken generally along a line 4—4 in Fig. 1.
Fig. 6 is a graph illustrating a tuning curve typical of the exemplary tuner.

If Figs. 1-4 are considered in greater detail, it will be seen that they illustrate an exemplary ultrahigh frequency tuner 11 which in this instance is adapted to cover the frequency range from 400 to 1000 megacycles. Those skilled in the art will realize that this frequency range includes the ultrahigh frequency television band from 470 to 890 megacycles.

To achieve a high Q or factor of merit, the exemplary tuner 11 includes a cavity resonator in the form of a conductive metallic housing 12. A cavity or chamber 13 is defined within the housing 12. More specifically, the illustrated housing 12 comprises rectangular, elongated front, rear, top, and bottom walls 14, 15, 16, and 17, as well as relatively short generally rectangular end walls 18 and 19. All of the walls may be formed of suitably conductive sheet metal.

In this instance, the cavity resonator 12 is of the reentrant type and hence is provided with a conductive arm or center post 20. It will be seen that the illustrated post 20 is of thin flat blade-like configuration and is mounted on the end wall 18 at a point near the center of the wall or at least well spaced from the side walls 14—17. The post extends longitudinally in the cavity 13 part way from the end wall 18 to the opposite end wall 19. It will be seen that the post 20 is substantially parallel to the front and rear walls 14 and 15.

Any known or suitable means may be employed to transfer or couple energy to and from the cavity resonator 12. In the illustrated tuner 11, for example, energy is adapted to be transferred to and from the resonator housing 12 by means of coaxial cables 21 and 22 having axial conductors 23 and 24 soldered or otherwise connected to the center post 20 at selected points, according to the impedances at which energy can be most efficiently coupled to and from the housing 12. It will be seen that the conductor 23 is connected to the center post 20 at a point relatively close to the housing wall 18, while the conductor 24 is connected at a point relatively remote from the wall 18. Accordingly, the cable 21 may be connected to a relatively low impedance input circuit while the cable 22 may extend to a relatively high impedance output circuit. The respective cables 21 and 22 are provided with cylindrical shielding braids 25 and 26, or other outer conductors, which are soldered or otherwise connected to the rear and front walls 15 and 14 of the housing 12.

To provide for varying the tuning of the cavity resonator 12, the tuner 11 is equipped with a second post or arm-like element 27 which in this instance is in the form of a relatively short tab mounted on the end wall 19 at a point generally opposite from the point on the end wall 18 at which the center post 20 is mounted. As shown, the tab 27 is thin, flat, resilient, and flexible, and may be made of sheet metal. The tab 27 and the center post 20 are in adjacent overlapping relation but are spaced apart.

In order to vary the tuning of the resonator housing 12, provision is made for effecting relative movement between the center post 20 and the tab 27. While either of these elements may be moved, the exemplary tuner 11 is arranged to provide for swinging or flexing movement of the tab 27. To this end, an insulating member or arm 28 is mounted as an extension on the tab 27. It will be seen that a sloping cam surface or track 29 is formed on the rear side of the insulating arm 28. Thus, the arm 28 constitutes a cam adapted to actuate the tab 27. In this instance, the cam surface 29 is engaged by an actuating follower in the form of an insulating roller 30 which is rotatably mounted on a roller shaft 31 extending generally radially from an insulating tuning shaft 32. As shown, the shaft 32 extends completely through the resonator housing 12 from front to rear and is journaled in the front and rear walls 14 and 15. A manually rotatable knob 33 may be mounted on the shaft. To define the limits of rotation of the shaft, an arm 34 is mounted on the shaft for movement between screws 35 and 36 or other stop elements. The range of movement of the shaft 32 thus is somewhat less than 180 degrees in this instance, although any desired range of movement may be provided. As shown to advantage in Fig. 3, the insulating extension 28 is curved to extend around the shaft 32 so that the cam track 29 will conform to the circular path followed by the roller 30. In operation, the tuning of the resonator housing 12 is varied by rotating the shaft 32 between the positions shown in Figs. 1 and 2. Because of the rising slope of the cam surface 29, the insulating arm 28 and the tab 27 are swung forwardly as the shaft 32 is rotated from the position shown in Fig. 1 to that shown in Fig. 2. It will be understood that the roller 30 travels in a diametrical plane and rolls along the cam surface 29. Surprisingly enough, the rather small range of movement of the tab 27 is sufficient to vary the resonant frequency of the tuner 11 between approximately 400 and 1000 megacycles. Also quite unexpectedly, the tuning curve is generally linear so that no portion of the curve is unduly crowded or spread out. This is illustrated to advantage in Fig. 6 which is a typical graph of frequency against displacement of the movable tab element. High Q's typical of cavity resonators are maintained throughout the tuning range.

It will be apparent that the swinging or flexing movement of the tab 27 relative to the center post 20 varies the capacitance between these elements. It is believed that the movement of the tab 27 may also change the inductive effect provided by the resonator housing 12 and that this may account for the unexpected degree of linearity of the tuning curve.

Figure 5:
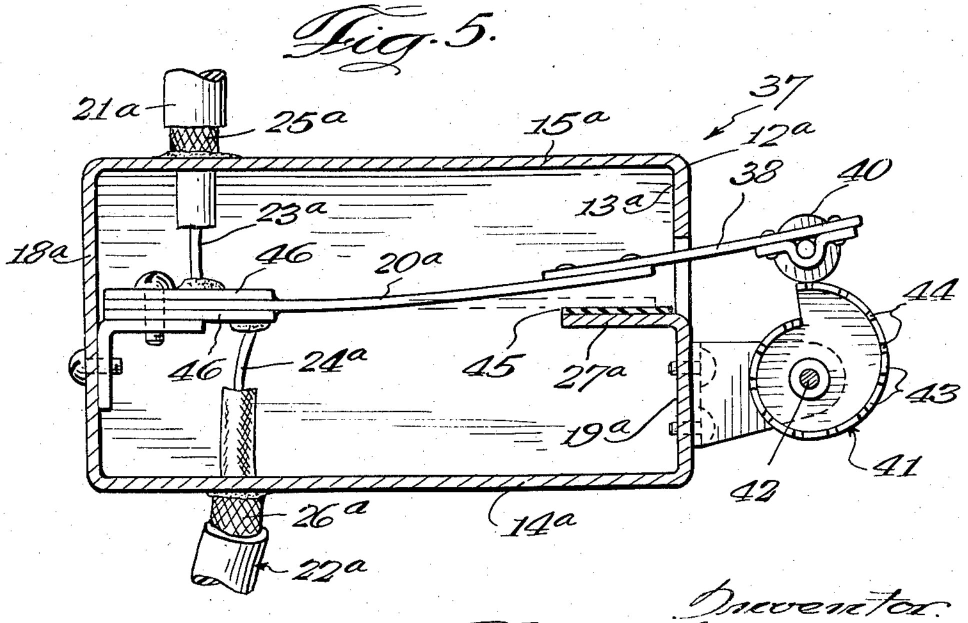
Fig. 5 is a somewhat diagrammatic sectional view of a modified tuner constituting a second illustrative embodiment of the invention.

It has already been noted that the resonant frequency of the tuner may be varied by moving either the center post or the post-like tab, which may be considered to be a second relatively short center post. Fig. 5 illustrates a modified tuner 37 which is similar to the tuner 11 except that the center post, rather than the tab, is moved to vary the tuning. Accordingly, those components of the tuner 37 which find their counterparts in the tuner 11 have been given corresponding reference characters with the addition of the suffix "*a*."

To provide for varying the tuning of the resonator housing **12*a* shown in Fig. 5, the center post 20*a* is equipped with an insulating extension arm 38 which in this instance extends out of the housing 12*a* through an aperture 39 in the end wall 19*a*. A cam follower roller 40 is rotatably mounted on the insulating arm 38 for engagement with a cam 41 which is rotatably supported by a tuning shaft 42. In this instance, the cam 41 is formed with a plurality of bendable tabs 43 separated by slots 44, as disclosed and claimed in the copending application of Harold T. Lyman, Serial No. 457,661, filed September 22, 1954, in order to provide for adjustment of the periphery of the cam. By virtue of this cam construction, the tracking of the tuner 37** may be adjusted so as to follow a predetermined tuning curve.

It will be seen that the tab or post-like arm **27*a* of the modified tuner 37 is stationary and is fitted with an insulating film or plate 45 which is disposed between the tab 27*a* and the center post 20*a* and hence is adapted to prevent these components from coming into direct contact at the low frequency end of the tuning range, as represented by the dotted line position of the center post 20*a***.

In the modified tuner 37, the center post **20*a* may be reinforced adjacent its base by means of side plates 46 in order that the coaxial input and output cables 21 and 22 may be connected to substantially stationary points on the center post. It will be understood that most of the flexing of the center post 20*a* will be in the portion extending beyond the plates 46. In this way, the center conductors 23*a* and 24*a*** will not be substantially flexed.

Various modifications, alternative constructions and equivalents may be employed without departing from the true spirit and scope of the invention as exemplified in the foregoing description and defined in the following claims.

I claim:

1. A tuner for ultrahigh radio frequencies, said tuner comprising a conductive resonator housing having a plurality of conductive generally rectangular conductively interconnected end and side walls defining a generally rectangular cavity therein, a thin flat conductive post mounted in said cavity on one end wall adjacent the center thereof and extending part way toward the opposite end wall, said post having a low impedance connection to said one end wall, a thin flexible conductive tab on said opposite end wall and generally parallel to and adjacent said post, said tab having a low impedance connection to said opposite end wall, and means for flexing said tab to vary the tuning of said resonator housing, said means including a rotatable insulating tuning shaft extending through said housing generally at right angles to said post and said tab, a roller shaft mounted radially on said tuning shaft, a roller rotatably mounted on said roller shaft, and an insulating member mounted on said tab and having a sloping cam surface engaging said roller whereby rotation of said tuning shaft swings said insulating member and said tab toward and away from said post.

2. A tuner for ultrahigh radio frequencies, said tuner comprising a conductive resonator housing having a cavity therein, a conductive post mounted on said housing in said cavity and having a low impedance connection to said housing, a flexible conductive tab on said housing and extending adjacent said post, said tab having a low impedance connection to said housing, and means for flexing said tab to vary the tuning of said resonator housing, said means including a rotatable insulating tuning shaft extending into said housing generally at right angles to said post and said tab, a roller shaft mounted generally radially on said tuning shaft, a roller rotatably mounted on said roller shaft, and an insulating member mounted on said tab and having a sloping cam surface engaging said roller whereby rotation of said tuning shaft swings said insulating member and said tab toward and away from said post.

3. A tuner for ultrahigh radio frequencies, said tuner comprising a conductive resonator housing having a plurality of conductive generally rectangular conductively interconnected end and side walls defining a generally rectangular cavity therein, a thin flat conductive post mounted in said cavity on one end wall adjacent the center thereof and extending part way toward the opposite end wall, said post having a low impedance connection to said one end wall, a thin flexible conductive tab on said opposite end wall and generally parallel to and adjacent said post, said tab having a low impedance connection to said opposite end wall, and means for flexing said tab to vary the tuning of said resonator housing, said means including a rotatable insulating tuning shaft mounted on said housing, a cam follower disposed radially on said shaft, and an insulating member mounted on said tab and having a sloping cam surface engaging said follower whereby rotation of said tuning shaft swings said insulating member and said tab toward and away from said post.

References Cited in the file of this patent

UNITED STATES PATENTS

| | | |
|---|---|---|
| 2,226,688 | Alford | Dec. 31, 1940 |
| 2,491,662 | Houghton | Dec. 20, 1949 |
| 2,587,136 | Gardner | Feb. 26, 1952 |
| 2,819,391 | Reiches | Jan. 7, 1958 |
| 2,821,623 | Thias | Jan. 28, 1958 |